United States Patent
Waltrich (10) Patent No.: US 11,392,734 B2
(45) Date of Patent: *Jul. 19, 2022

(54) APPARATUSES, SYSTEMS, AND METHODS FOR PERFORMING REMOTE REAL-TIME EXPERIMENTS

(71) Applicant: BOARD OF SUPERVISORS OF LOUISIANA STATE UNIVERSITY AND AGRICULTURAL AND MECHANICAL COLLEGE, Baton Rouge, LA (US)

(72) Inventor: Paulo J. Waltrich, Baton Rouge, LA (US)

(73) Assignee: BOARD OF SUPERVISORS OF LOUISIANA STATE UNIVERSITY AND AGRICULTURAL AND MECHANICAL COLLEGE, Baton Rouge, LA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/692,486

(22) Filed: Nov. 22, 2019

(65) Prior Publication Data

US 2020/0089825 A1 Mar. 19, 2020

Related U.S. Application Data

(63) Continuation of application No. 14/920,603, filed on Oct. 22, 2015, now Pat. No. 10,489,523.

(Continued)

(51) Int. Cl.
*G06F 9/445* (2018.01)
*G01F 1/74* (2006.01)
(Continued)

(52) U.S. Cl.
CPC .......... *G06F 30/20* (2020.01); *G06F 9/44505* (2013.01); *G06F 30/15* (2020.01); *E21B 49/00* (2013.01); *G01F 1/74* (2013.01)

(58) Field of Classification Search
CPC ...... G06F 30/20; G06F 30/15; G06F 9/44505; G06F 30/25; G06F 30/27; G06F 30/28; G01F 1/74; E21B 49/00
See application file for complete search history.

(56) References Cited

U.S. PATENT DOCUMENTS

| 2002/0127597 A1* | 9/2002 | Chen ...................... G06N 20/00 435/7.1 |
| 2002/0147799 A1* | 10/2002 | Alhalabi .............. G05B 19/042 709/220 |

(Continued)

FOREIGN PATENT DOCUMENTS

JP 2002031549 * 1/2002

OTHER PUBLICATIONS

Bello, et al. "Experimental validation of multiphase flow models and testing of multiphase flow meters: a critical review of flow loops worldwide" WIT Transactions on Engineering Sciences, vol. 56, pp. 97-111; doi: 10.2495/MPF070101 [retrieved on Dec. 13, 2017], (Year: 2007).*

(Continued)

*Primary Examiner* — Rehana Perveen
*Assistant Examiner* — Alfred H B Wechselberger
(74) *Attorney, Agent, or Firm* — Thomas | Horstemeyer, LLP (57) ABSTRACT

Embodiments of the present invention include apparatuses and methods for performing remote experiments in real-time. The method includes sending requests to perform remote experiments for a desired configuration to a first and second facility. The desired configuration may include a first (Continued)

and second configuration. The method includes running a first remote experiment in real-time at the first facility to obtain a first output variable. The first facility may include the first configuration with a first input variable. The method includes simultaneously running a second remote experiment in real-time at a second facility to obtain a second output variable. The second facility may include the second configuration with a second input variable. The first output variable may be set as the second input variable to mimic the desired configuration. The method includes obtaining experimental results of the desired configuration via the first and second input and output variables.

17 Claims, 5 Drawing Sheets

Related U.S. Application Data (60) Provisional application No. 62/067,315, filed on Dec. 22, 2014.

(51) Int. Cl.
*G06F 30/20* (2020.01)
*G06F 30/15* (2020.01)
*E21B 49/00* (2006.01)

(56) References Cited

U.S. PATENT DOCUMENTS

| | | | | |
|---|---|---|---|---|
| 2003/0055582 | A1* | 3/2003 | Horiuchi | G01M 7/00 702/56 |
| 2004/0249677 | A1* | 12/2004 | Datta | G16B 50/30 705/3 |
| 2008/0215705 | A1* | 9/2008 | Liu | G06Q 10/10 709/217 |

OTHER PUBLICATIONS

Costantini, et al. "Using Transient Inflow Performance Relationships to Model the Dynamic Interaction Between Reservoir and Wellbore During Pressure Testing" Journal of Energy Resources Technology, vol. 130 [retrieved on Dec. 15, 2017], Retrieved from STIC. (Year: 2008).*

Waltrich, P. "Onset and Subsequent Transient Phenomena of Liquid Loading in Gas Wells: Experimental Investigation Using a Large Scale Flow Loop" [thesis] Texas A&M University [retrieved on Dec. 13, 2017], (Year: 2012).*

Noh et al. "A Case Study: Hybrid Simulation on the KOCEDgrid System" 2006 International Conference on Hybrid Information Technology: IEEE Computer Society [retrieved on Jul. 26, 2018]. Retrieved from <https://ieeexplore.IEEE.org/document/4021091> (Year: 2001).*

Sato et al. "Haptic Telexistence" SIGGRAPH '07: ACM SIGGRAPH 2007 emerging technologies, DOI: 10.1145/1278280. 1278291 [ retrieved on Apr. 21, 2021]. Retrieved from <https://dl.acm.org/doi/abs/10.1145/1278280.1278291> (Year: 2007).*

Schaf et al. "Integrating Mixed-Reality Remote Experiments Into Virtual Learning Environments Using Interchangeable Components " IEEE Transactions on Industrial Electronics, vol. 56, No. 12 [retrieved on Jul. 26, 2018] (Year: 2009).*

* cited by examiner

APPARATUSES, SYSTEMS, AND METHODS FOR PERFORMING REMOTE REAL-TIME EXPERIMENTS

CROSS-REFERENCE TO RELATED APPLICATIONS

This application is a continuation of U.S. patent application Ser. No. 14/920,603, filed Oct. 22, 2015, which claims the benefit of U.S. Provisional Patent Application No. 62/067,315, filed on Oct. 22, 2014, the entire contents of each of which are incorporated herein by reference.

Multiphase flow in pipes is a complicated problem. Two methods are commonly used to investigate the multiphase flow characteristics in pipes and optimize their production: (1) steady-state correlations, which are derived from massive experimental data with limited flow conditions; and (2) steady-state or transient mechanistic models, which are subjected to experiment-derived closure relationships. Both methods present generic mathematical models to predict well performance for a wide range of scenarios. However, the accuracy of such models is limited to the range of flowing conditions included in empirical correlations and closure relationships. Indeed, engineers have to often extrapolate these empirical correlations without fully understanding the consequences of such extrapolations.

Additionally, in some high pressure/temperature or near-critical point fluid reservoirs, the pressure-volume-temperature (PVT) characterization may be dramatically inaccurate. Flow assurance is another important issue when investigating problems in transporting hydrocarbon fluids in the oil and gas industry.

However, insufficient information or knowledge currently exists regarding how to model these phenomena or how to mathematically characterize the effect of compositional changes while hydrocarbons are flowing in wellbores and pipelines. The usual way to characterize these complex phenomena is to move the well site into a lab and conduct experiments to determine potential responses/results. Field scale facilities have been developed all over the world in the past few decades. These facilities include, but are not limited to, the (1) PERTT Lab at Louisiana State University ("Facility 1"), (2) SINTEF Multiphase Flow Laboratory in Norway ("Facility 2"), (3) TowerLab at Texas A&M University ("Facility 3"), and the (4) TUFFP Facility at University of Tulsa ("Facility 4"). These facilities feature field-scale wells with depths up to 5,800-ft deep and a variety of configurations and capabilities, which may be used for training, testing, and research related to multiphase flow in wellbores and surface equipment. For example, Facility 1 includes field-scale vertical wells and field equipment availability, while Facility 2 features a field-scale horizontal pipeline and high-pressure equipment set-ups used to investigate multiphase flows. A study conducted by Falcone et al. (2008) includes a worldwide review of available research facilities for multiphase flow testing, highlighting the capabilities of these facilities.

The development of Facilities 1 to 4 likely required a large capital investment. However, other facilities around the world are still being built to perform tests that are already available in these major laboratories/facilities. In fact, many of these laboratories are being partially replicated over and over again, with millions of dollars being spent every year to build new experimental equipment with very similar characteristics/features as these pre-existing facilities. Indeed, building new lab facilities demand a significant amount of investment; however, the subsequent use of the same labs appears to be minimal. In Australia alone, it is estimated that 400 million dollars is spent every year to develop new labs, but only 10% of these labs are being used after they become operational.

As long as a facility has a desired configuration, it can reproduce a wide range of configurations of production systems and scenarios found in the oil and gas industry. Examples of these configurations and scenarios include, for example, pipelines with different diameters and geometrical configurations (vertical, horizontal, and inclined), multiple wells, and flow-assurance related problems such as wax/paraffin deposition in pipes and hydrate formation, downhole equipment design and optimization. However, research facilities are generally far away from company working sites, and are often not user friendly, requiring external technical staff to carry out experimental runs.

An ideal laboratory may combine all the features from these different facilities in a unique laboratory to cover a majority of the challenges found regarding multiphase flow in the oil and gas industry. However, developing a new lab with all these features or physically moving all this infrastructure to one single location will likely be extremely expensive and time consuming.

Now, with increased speed and reliability of electronics and networking computing technology, some efforts have been made in the past thirty years to develop laboratories using automation systems to schedule, control, and acquire test results though the internet. Earlier studies in the oil and gas industry involved the development of an automation system to schedule and monitor, from a remote computer, tests of laboratory displacement experiments, the main objective being to run a displacement test to measure permeability, which requires long waiting periods to finish the tests. The automation system provided for a safe environment for high pressure tests and required minimal operator intervention to perform all needed tests. Further, the remote experiment was capable of controlling pump rate, valve switching, scheduling tests, and acquiring results over the internet. Another recent study at Texas A&M University developed a remote real-time system to control, visualize, save acquired data, and compare experimental data simultaneously with numerical models for Facility 3.

The use of these remote experiments may also open new avenues to the implementation of hardware-in-the-loop (HIL) studies applied to petroleum engineering problems. HIL requires very similar hardware and software to what is required to perform remote experiments. HIL has been successfully applied in the automotive and aviation industry, saving millions of dollars while testing new technologies. For example, HIL allows for testing of an autopilot system in the aviation industry without performing the tests using an airplane. Also, extremely harsh conditions can be tested in cars without the need for actually creating these harsh conditions in a lab. In other words, when a scenario is too difficult to be created in a lab, a simulator can simulate and generate the output of such an environment using, for example, electronic sensors and actuators. In the petroleum industry, HIL may be used to test downhole equipment under extreme high-pressure and high-temperature, without the need of testing such equipment downhole and in harsh conditions. For example, one study by Pedersen and Smogeli (2013) developed a HIL testing experimental set-up for drilling control systems, without the need for bring these new control systems to the field.

Because experiments are usually expensive, time consuming, and require specialized apparatus, the use of numerical simulators have also spread exponentially in the oil and gas industry. The cost of numerical simulation is relatively cheap and easy to use, and can very often present results in a matter of seconds. However, the development of numerical models may sometimes take weeks to be accomplished, and any ensuing results may be questionable without proper validation with experimental data. This is particularly true for newly developed techniques and equipment, when reliable mathematical models may not always be readily available, and implementation in the field may be time consuming and expensive.

Further, most of the numerical models being used (particularly in multiphase flow) still require the use of empirical correlations or closure relationships derived from experiments—which have limitations regarding the range of conditions used to generate these empirical relationships. Along with increased sophistication of numerical models over the years, experiments have also become specialized to investigate and validate these same models. However, since different fields of expertise are involved in these (multiphase flow) models, the results of any specialized experiments in these fields have generally not been available in one particular facility/institution; rather, the labs conducting these specialized experiments are located all over the world. Thus, since data is needed from multiple labs/facilities located worldwide, validation of simulators that includes multiple physical phenomena has become extremely difficult and time consuming.

Embodiments of the present invention relate to apparatuses, systems, and methods for performing remote experiments, and in particular though non-limiting embodiments, to apparatuses, systems, and methods for performing remote real-time experimental diagnostics for well challenges.

In an exemplary embodiment of the present invention, a method for performing remote experiments is provided. The method includes sending at least a first request and a second request to perform remote experiments for a desired configuration to at least a first facility and second facility, respectively. The desired configuration may include at least a first configuration and a second configuration. The method includes running a first remote experiment in real-time at the first facility to obtain a first output variable. The first facility may include the first configuration with a first input variable. The method includes simultaneously running a second remote experiment in real-time at a second facility to obtain a second output variable. The second facility may include the second configuration with a second input variable. The method includes obtaining experimental results of the desired configuration using the first and second input and output variables. The first remote experiment may communicate with the second remote experiment such that the first output variable is set as the second input variable to mimic the desired configuration.

The method may include using a numerical simulator to perform numerical simulations of the desired configuration and obtain simulated results, and to validate and tune the simulated results with the experimental results. The method may include using a server to send the first and second requests to perform remote experiments to the first or second facilities, respectively. The server may include a database of results from previously run remote experiments. The server may be configured to search the database for results from remote experiments previously run for the desired configuration. The method may include using the server to receive the first output variable from the first facility, and to send the first output variable to the second facility for use as the second input variable. The method may include using a first data acquisition system at the first facility, and a second data acquisition system at the second facility. The first data acquisition system may receive the first request for remote experiments and run the first remote experiment at the first facility to obtain the first output variable. The second data acquisition system may receive the second request for remote experiments and run the second remote experiment at the second facility to obtain the second output variable. The second data acquisition system may receive the first output variable from the first facility for use as the second input variable. The first and second data acquisition systems may operate valves, pumps and compressors to set the first input variable and second input variable. The first input and output variables and second input and output variables may include at least one of temperature, pressure, and flow rate. The desired configuration may be a vertical pipe connected to a horizontal pipe. The first configuration may be the vertical pipe, and the second configuration may be the horizontal pipe. The desired configuration may be a wellbore-reservoir. The first configuration may be a porous medium, and the second configuration may be a vertical pipe.

In an exemplary embodiment of the present invention, a method for performing remote experiments is provided. The method includes performing numerical simulations and obtaining simulated results of a desired configuration via a numerical simulator. The desired configuration may include at least a first configuration and a second configuration. The method includes sending at least a first request and a second request to perform remote experiments for the desired configuration to at least a first facility and second facility, respectively. The method includes running a first remote experiment at the first facility to obtain a first output variable. The first facility may include the first configuration with a first input variable. The method includes simultaneously running a second remote experiment at a second facility to obtain a second output variable. The second facility may include the second configuration with a second input variable. The method includes obtaining experimental results of the desired configuration using the first and second input and output variables. The method includes validating and tuning the simulated results with the experimental results using the numerical simulator. The first remote experiment may communicate with the second remote experiment such that the first output variable is set as the second input variable to mimic the desired configuration.

The method may include using a server to send the first and second requests to perform remote experiments to the first or second facilities, respectively. The server may include a database of results from previously run remote experiments. The server may be configured to search the database for results from remote experiments previously run for the desired configuration. The method may include using the server to receive the first output variable from the first facility, and to send the first output variable to the second facility for use as the second input variable. The method may include using a first data acquisition system at the first facility, and a second data acquisition system at the second facility. The first data acquisition system may receive the first request for remote experiments and run the first remote experiment at the first facility to obtain the first output variable. The second data acquisition system may receive the second request for remote experiments and run the second remote experiment at the second facility to obtain the second output variable. The second data acquisition system may receive the first output variable from the first facility for use as the second input variable. The first and second data acquisition systems may operate valves, pumps and compressors to set the first input variable and second input variable.

In an exemplary embodiment of the present invention, a system for performing remote experiments is provided. The system includes a user, a server, a first facility and a second facility, and a first data acquisition system and a second data acquisition system. The user may send a request to the server for experimental results of a desired configuration. The desired configuration may include at least a first configuration and a second configuration. The server may send at least a first request and a second request to perform remote experiments for the desired configuration to at least the first facility and second facility, respectively. The first data acquisition system may run a first remote experiment in real-time at the first facility to obtain a first output variable. The first facility may include the first configuration with a first input variable. The second data acquisition system may run a second remote experiment in real-time at a second facility to obtain a second output variable. The second facility may include the second configuration with a second input variable. The second data acquisition system may obtain experimental results of the desired configuration using the first and second input and output variables. The first remote experiment may communicate with the second remote experiment such that the first output variable is set as the second input variable to mimic the desired configuration.

The system may include a numerical simulator configured to perform numerical simulations and produce simulated results of the desired configuration, and also validate and tune the simulated results with the experimental results. The server may include a database of results from previously run remote experiments. The server may run a search of the database for results from remote experiments previously run for the desired configuration. The server may receive the first output variable from the first facility, and send the first output variable to the second facility for use as the second input variable. The second data acquisition system may receive the first output variable from the first facility for use as the second input variable. The first and second data acquisition systems may operate valves, pumps and compressors to set the first input variable and second input variable. The first input and output variables and second input and output variables may include at least one of temperature, pressure, and flow rate.

DETAILED DESCRIPTION

Embodiments of the present invention provide for apparatuses, systems, and methods for performing remote real-time experiments for well challenge diagnostics to access experimental results/data for a particular configuration, and consequently, to more cost-effectively evaluate production diagnostics of well challenges related to multiphase flow. Particularly, embodiments of the present invention provide for systems and methods of remotely running in real-time one or more interconnected experiments physically located at different locations/facilities across the world. The experimental data may be used to further validate and tune simulated data/results obtained from simulation models of the particular configuration. The present invention also provides for systems and methods for using remote real-time experiments to run tests to evaluate well challenges without the need of mathematical models; rather, the system may communicate with numerical models to perform simulations. This system may be controlled and visualized in real-time from any computer, smartphone, tablet, or any other similar device with a user interface, as well as from any place where internet access is available.

In embodiments, different experimental set-ups/facilities may be remotely integrated with a web-based system so as to improve accessibility, flexibility, and enhance the cost-benefit of building new labs/facilities for well challenge diagnostics. Particularly, a user-friendly online environment may provide a link between numerical simulators and field data validation, thereby improving the dynamics and reliability of validating simulation results, as well as making validation of newly developed equipment/techniques faster and enhancing demonstration of new engineering services and products.

Embodiments of the present invention may allow users to validate and tune their simulation results in real-time with live experimental data for a wide range of conditions by simultaneously using different facilities around the world, which may then significantly increase the level of accuracy of numerical simulators. Running remote experiments simultaneously with numerical simulators may also enhance the accuracy and range of application of known mathematical models. The use of remote experiments may further aid in reducing costs among different facilities and also increase the frequency of usage of such experiments by these facilities, thereby improving the cost-benefit of building new labs/facilities. Additionally, the use of remote experiments to run diagnostic tests may enhance the spreading of technology, since more people can be reached by the demonstration of these types of experiments, which was previously exclusively used by local users at these facilities.

Embodiments of the present invention provide for various methods to perform remote experiments for well challenge diagnostics. In exemplary embodiments, remote experiments may be performed via real-time remote experiments to test well challenges using (1) automatic interaction between remote experiments; and (2) real-time validation and tuning of numerical simulations.

Real-Time Remote Experiments to Test Well Challenges Using Automatic Interaction Between Remote Experiments The primary barrier to perform remote experiments for well challenge diagnostics is to design and implement an experimental set-up such as the laboratory facilities described herein (for e.g., Facilities 1 to 4) having the necessary equipment and software to allow for remote use. These experimental set-ups/laboratory facilities must be able to cover a wide range of conditions. For example, certain geometries for a well configuration have to be built (namely, for e.g., vertical, inclined and horizontal wells), with different pipe diameters and configurations (for single and multiple completions, and flow through production tubing and casing-annulus). Once these facilities are made available for a variety of geometries and operational conditions, they may be used to remotely run several different experimental diagnostics in multiphase flow.

Figure 1:
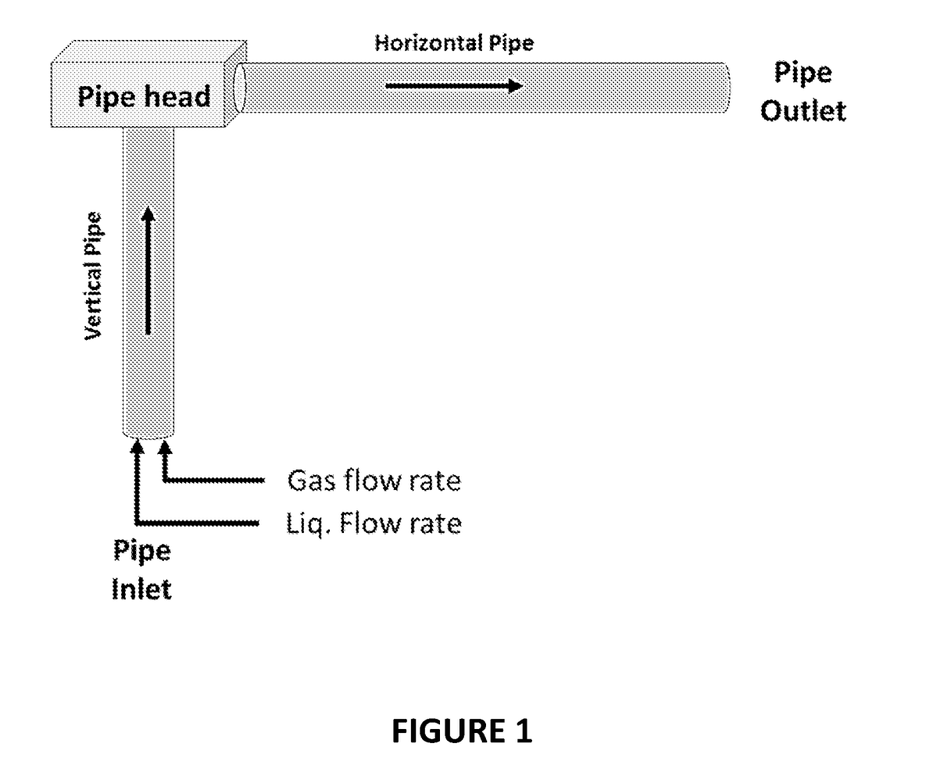
FIG. 1 is an illustration of a pipeline configuration for an engineering problem that may require the use of remote experiments.

Referring to FIG. 1, a pipeline configuration for a typical engineering problem that may require the use of the use of remote real-time experiments is shown. This particular configuration is shown purely for illustrative purposes, and will be used as a continuing example to illustrate the systems and methods described in FIGS. 2, 3, and 4. However, embodiments of the present invention may be used for any other problems/issues that require access and validation of experimental data from one or more remote facilities. See, e.g., FIG. 5.

FIG. 1 shows a connection of a vertical pipeline to a horizontal pipeline—a situation very commonly found in subsea systems. Here, liquid and gas flows through the vertical pipe connected to the horizontal pipe. A user/engineer may need to solve several engineering problems associated with this particular configuration. In exemplary embodiments, the engineer/user may wish to obtain the pressure profile of the pipe, and thereby determine the forecasted production of the pipe, and verify risk of hydrate in the flowlines (using the flowing pressure and temperature information to verify the hydrate envelope. As shown in FIG. 1, the user may need to determine the pressure in the pipe outlet for a particular pressure and flow rate of gas and liquid in the pipe inlet.

To solve this problem, the user/engineer may need to numerically simulate the pressure in the pipe outlet using a type of commercial software. In an exemplary embodiment, the software may be the PIPESIM® Steady-State Multiphase Flow Simulator software by Schlumberger®. This software simulates multiphase flow in pipes, but often requires experimental or field data to validate its results. To perform the numerical simulation and obtain simulated results, the user/engineer may first set an initial configuration. As shown in FIG. 1, the user/engineer may input the diameters of the vertical and horizontal pipes, as well as the pressure and liquid and/or gas flow rate at the pipe inlet. The numerical simulator software may then use its built-in theoretical models to mathematically calculate/predict the results for this problem to obtain certain simulated results. In an exemplary embodiment, the simulator will calculate/predict the pipe outlet pressure based on the particular initial configuration and conditions set by the user. Since the simulated results are simply theoretical and mathematical predictions of the physical system, the user/engineer may then need to confirm and validate/compare the simulated results with actual experimental results derived from the same configuration, in order to ensure that the simulated results match with the experimental results. For the problem illustrated in FIG. 1, the user/engineer may need to compare the predictions/simulations of the pipe outlet pressure with the experimental/actual results from a physical system having this configuration.

Figure 2:
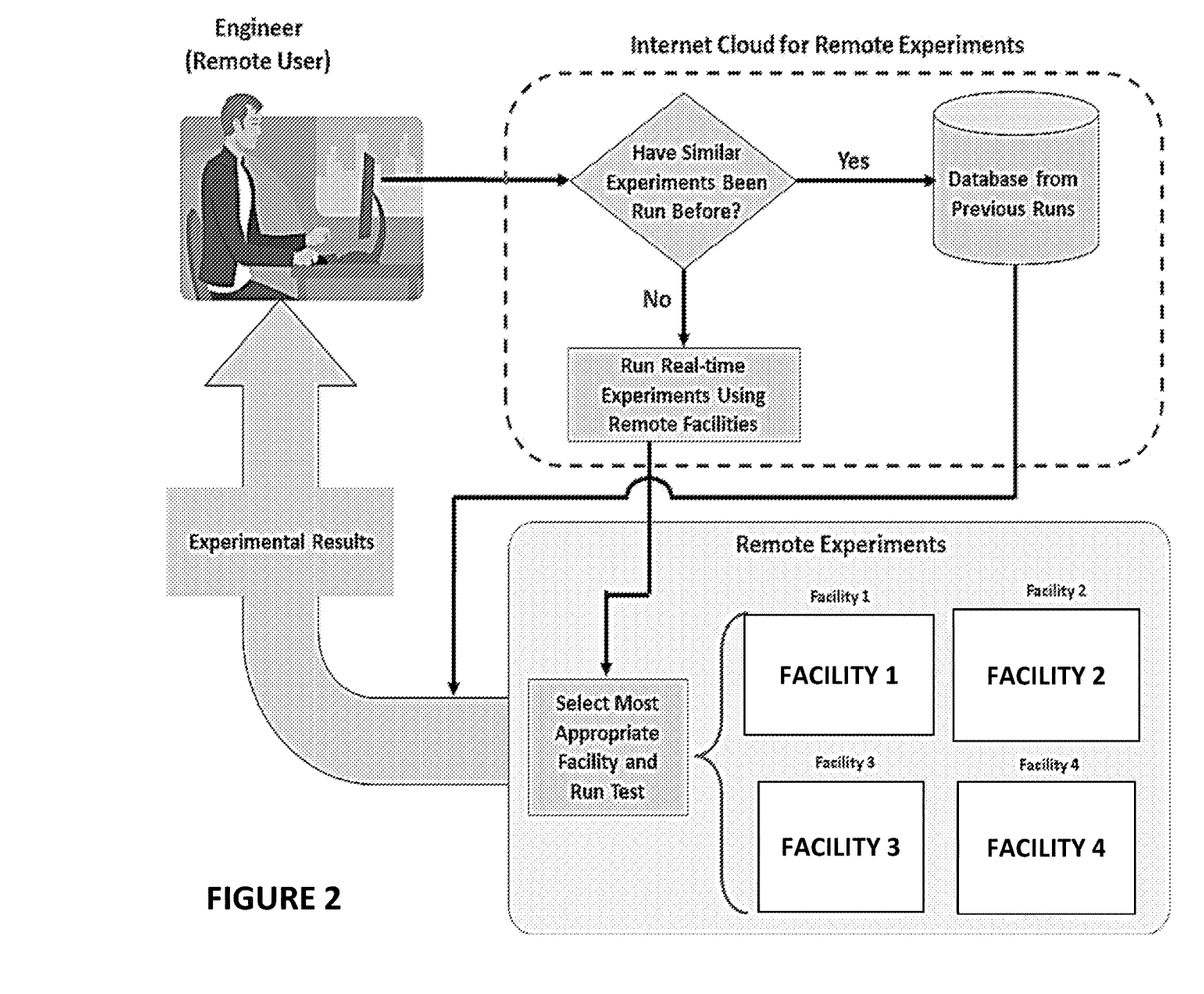
FIG. 2 is a flowchart of a method for performing remote real-time experiments, according to an exemplary embodiment of the present invention.
Figure 3:
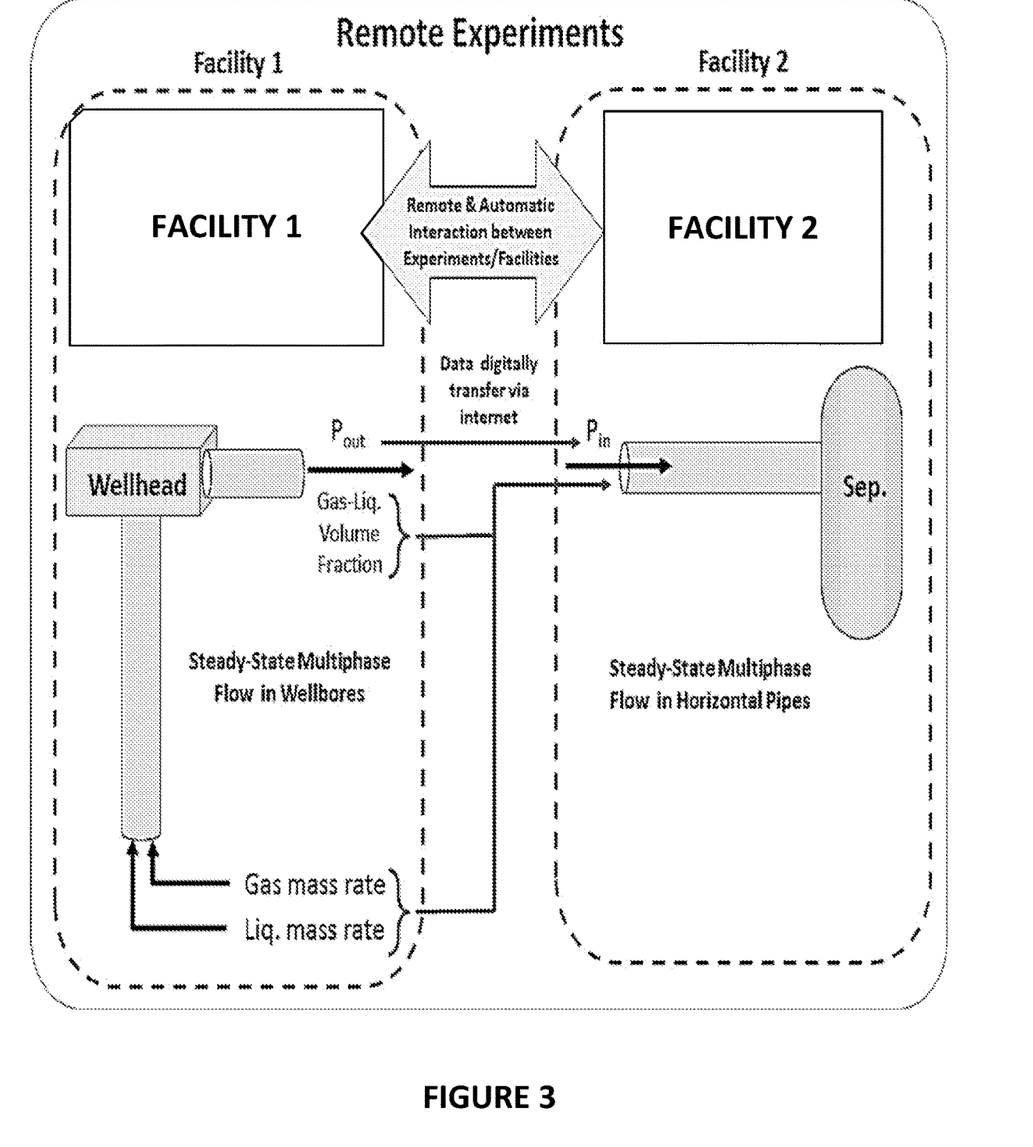
FIG. 3 is a flowchart of a system for automatic interaction between facilities in different locations, according to an exemplary embodiment of the present invention.

Referring to FIG. 2, a flowchart for a system and method for performing remote real-time experiments to access experimental data is shown. FIG. 3 depicts a flowchart of a system for remote and automatic interaction between experimental set-ups/facilities in different locations. The system and method shown in FIG. 2 may or may not include the system for remote and automatic interaction shown in FIG. 3. As shown, FIG. 2 provides for systems and methods whereby an engineer/user may simply need to obtain experimental results from one or more remote facilities, without performing any prior numerical simulation. However, FIG. 2 is not limited to such situations, and may also include situations where the engineer/user may obtain certain simulated results for a particular problem/configuration, and may then need to validate/compare these simulated results with experimental results obtained from a physical system having this same configuration. Further, although embodiments of the present invention provide for performing real-time experiments, experiments may also be performed non-real-time via previously saved experiments and/or simulations, as described herein.

FIG. 2 illustrates a simplified system for obtaining/accessing experimental results from remote facilities. A user/engineer may first use a computer including certain software to access a server for remote experiments. Computer may encompass any suitable processing device, including but not limited to a PC, tablet, and/or mobile phone. Computer may be adapted to execute any operating system including Linux™, UNIX™, Windows™, or any other suitable operating system. Server may be physical or web based (e.g., Amazon Web Services). Server may be a commercially available server, e.g. an IBM System x M5 Tower servers. As shown, the server is an internet-based server located in the cloud. In exemplary embodiments, the server will contain a database of data from previously ran experiments. The software may send a series of instructions simultaneously to the server for remote experiments. In exemplary embodiments, the internet-based server may then automatically use an algorithm to determine whether to send requests for remote experiments to certain facilities.

In exemplary embodiments, the algorithm may follow a particular series of steps. First, the server may run a search of the database of saved experimental data for experimental data from remote experiments previously ran by other users at similar conditions in different facilities in the database, including for example, Facilities 1, 2, 3, and 4 described herein. However, the database may include experimental data from any other facilities/experimental set-ups. As shown in FIG. 2, the software may access the server to determine whether an experiment has already been run to determine a pipe outlet pressure for the pipeline configuration shown in FIG. 1. If these conditions were previously ran and saved in the database to obtain experimental results for the desired configuration, these results may be sent back to the remote user/engineer for further validation. On the other hand, if these conditions were not previously ran, the server may then scan the list of facilities in the database, and send a request to perform an experiment via the internet to most appropriate facility/facilities for the particular conditions/configurations described by the user. A remote experiment may then start running in a particular facility and/or interact with other facilities if necessary. However, if another user is already using a desired facility, the cloud system may schedule a remote experimental test in another available facility or book a test at an alternative timeslot in the original facility.

In exemplary embodiments, Data Acquisition Systems/Data Acquisition/control systems (DAQ or DAS) may be located at a facility and configured to communicate with the server and receive a request to perform a remote experiment. In an exemplary embodiment, the DAQ system may be any DAQ system offered by National Instruments®. Data acquisition is the process of sampling signals that measure real world physical conditions/phenomena (for e.g., temperature and pressure) and converting the resulting samples into digital numeric values that may be manipulated by a computer. DAQs are a collection of software and hardware that measure or control certain physical characteristics in the real world. DAQs typically convert analog waveforms into digital values for processing. A DAQ may include DAQ measurement hardware, sensors and actuators, and a computer running programmable DAQ software. The sensors may be used to convert physical parameters to measurable electrical signals. The DAQ hardware may act as the interface between a computer and signals from the outside world, and may primarily function as a device that digitizes incoming analog signals so that a computer can interpret them.

The DAQ hardware may include signal conditioning circuitry, an analog-to-digital converter (ADC), and a computer bus. Signal conditioning circuitry may manipulate a signal into a form that is suitable for input into an ADC. ADC may convert analog signals from sensors into digital signals prior to being manipulated by digital equipment such as a computer. The computer bus may serve as the communication interface between the DAQ device and computer for passing instructions and measured data.

The computer with programmable DAQ software may control the operation of the DAQ device and may be used for processing, visualizing, and storing measurement data. The DAQ software may include driver software and application software. Driver software may provide application software with the ability to interact with a DAQ device. It may simplify communication with the DAQ device by abstracting low-level hardware commands and register-level programming. Typically, DAQ driver software may expose an application programming interface (API) that is used within a programming environment to build application software. Application software may facilitate the interaction between the computer and user for acquiring, analyzing, and presenting measurement data. It may either be a prebuilt application with predefined functionality, or a programming environment for building applications with custom functionality. Custom applications may often be used to automate multiple functions of a DAQ device, perform signal-processing algorithms, and display custom user interfaces. In other embodiments, any other type of data acquisition systems may be used to receive requests from the server to perform remote experiments. In an exemplary embodiment, the DAQ software may be LabVIEW® by National Instruments®.

In embodiments of the present invention, one facility may have the exact configuration that is requested by the server, in which case the remote experiment may be performed, and experimental data derived, from this facility. However, in other embodiments, multiple facilities may have aspects of the requested configuration. For example, as shown in FIG. 3, Facility 1 and Facility 2 together have the requested configuration similar to FIG. 1. However, any other facilities having a desired configuration to perform remote experiments and access experimental data may be used. Facility 1 has the capability of testing steady-state multiphase flows in field scale vertical pipes/wellbores (up to 5,800 feet deep). Facility 1 also includes a short horizontal section of pipe (approximately 20 feet long). However, Facility 1 does not offer detailed instrumentation on long horizontal pipeline test sections at the surface. On the other hand, Facility 2 features field scale (2,600 feet long) horizontal pipeline as test sections with advanced instrumentation, but does not have vertical wells on site.

In embodiments of the present invention, the server may send a request to Facilities 1 and 2 to perform automatic and remote interconnected experiments to obtain experimental data regarding the pipe outlet pressure for the particular configuration of pipeline shown in FIG. 1. As described herein, these requests may be received by DAQ systems located at both facilities. In Facility 1, a first DAQ system may operate electric actuated valves, pumps and/or gas compressors to set conditions in the inlet of the vertical pipe in Facility 1. These valves, pumps and/or compressors may be connected to the inlet of any facility which is intended to be used remotely. In an exemplary embodiment, valves, pumps and/or compressors are connected to the inlet of both Facility 1 and Facility 2. Particularly, the electric actuated valves (which may be controlled by a voltage signal coming from the first DAQ system), and the pumps with variable speed drives (which may control the flow rate and pressure at the inlet of the pipes in Facilities 1 and 2) may be used to set pressure and flow rates at the inlet of the remotely controlled Facilities 1 and 2. The sensors within the first DAQ system may measure the output pressure and flow rates of Facility 1 and convert them into electrical signals, which may then be converted into digital pressure and flow rate information. This information may then be sent back via the internet to the server, which may then redirect the same information to a second DAQ system located at Facility 2. Upon receiving this information, the second DAQ system may similarly operate electric actuated valves, pumps and/or gas compressors to reproduce the levels of pressure and flow rate from the outlet of Facility 1 in the inlet of the horizontal pipe of Facility 2.

As shown in FIG. 3, output pressure results are calculated from short horizontal pipe connected to the vertical pipe in Facility 1 ($P_{out}$) using the known configurations of the pipes in Facility 1, as described herein. In exemplary embodiments, these output pressure results of Facility 1 ($P_{out}$) may then be used as the same input pressure for the horizontal pipeline in Facility 2 ($P_{in}$) to simulate an actual physical arrangement between Facility 1 and Facility 2. This transfer of pressure information from Facility 1 to Facility 2 may be accomplished by digital transfer over the internet using the DAQ systems as described herein. In other embodiments, other conditions (for e.g., temperature, flow rate) from the outlet of a facility may also be transferred and used as the input conditions in the inlet of another facility. At this point, once the requested conditions are transferred and/or controlled, Facilities 1 and 2 may mimic the exact pipeline configuration described herein and shown in FIG. 1. Although this type of outlet/inlet coupling may not fully represent all the conditions in a physical system where both a vertical and horizontal pipeline are physically connected, embodiments of the present invention may still provide an alternative and dynamic method of testing this type of configuration when it is not feasible to reproduce this exact physical arrangement in a single facility.

The desired experimental results/data may then be acquired through the DAQ system located in Facility 2. In various embodiments, these experimental results may be sent to and stored in the server, sent back to numerical simulator or other software, and/or sent back directly to the user.

Real-Time Remote Experiments to Test Well Challenges Using Real-Time Validation and Tuning of Numerical Simulations In embodiments of the present invention, remote experiments may be performed for well challenges diagnostics via real-time validation and tuning of numerical simulations. As discussed herein, real production data may not be available at the designing phase of a project or for particular desired configurations, and so a user/engineer may run simulations and obtain tentative simulated results without validation as to the accuracy of these results. FIGS. 2 and 3 illustrated systems and methods for performing remote real-time experiment by accessing certain experimental results, with or without the need for simulators. However, in exemplary embodiments, an engineer/user may obtain certain simulated results using numerical simulators for a particular problem/ configuration as described herein, and then use the numerical simulators to further validate/tune and/or substantiate simulation results with experimental results directly obtained dynamically and in real-time via automatic interaction between remote facilities/experimental set-ups, using the systems and methods shown in FIGS. 2 and 3.

Figure 4:
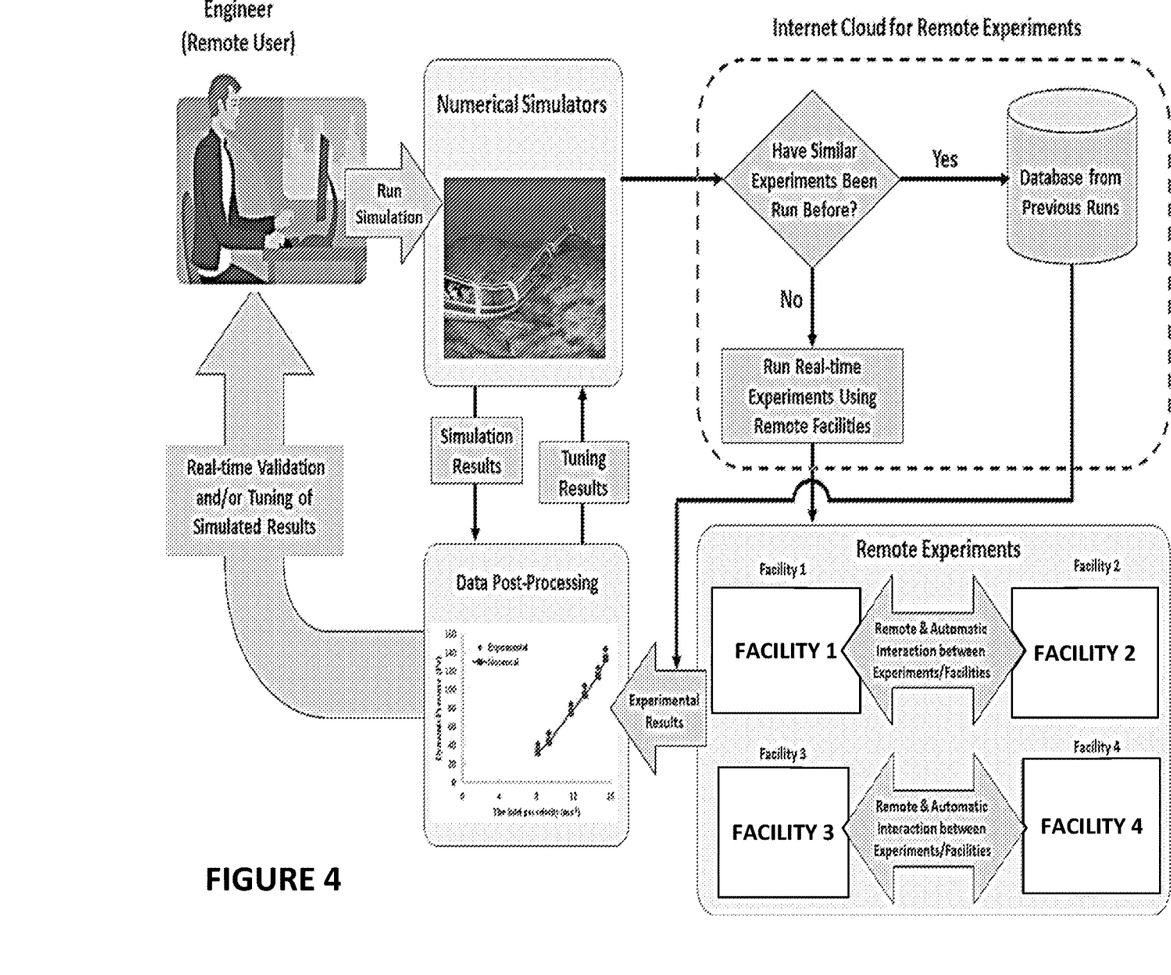
FIG. 4 is a flowchart of a method for performing remote real-time experiments, according to an exemplary embodiment of the present invention.

Referring to FIG. 4, a flowchart of a system and method for performing remote real-time experiments for well challenges diagnostics using numerical simulators is shown. In an exemplary embodiment, a user/engineer may need to simulate and obtain experimental data from a connection of vertical wells to horizontal pipelines. See, e.g., FIG. 1. The engineer/user may first set an initial configuration/conditions of the pipelines and then numerically simulate the pressure in the pipe outlet using a type of commercial software as described herein to obtain certain simulated results. Once these simulated results are obtained, the engineer may then access experimental data for a physical system having this same configuration via the steps and components described herein for FIGS. 2 and 3. In an exemplary embodiment, these experimental results may be stored in a server and/or send back to the numerical simulator software that was used for obtaining the simulated results. The experimental results may then be compared to the simulated/numerical results in a "Data Post-Processing Box." As shown in FIG. 4, the Data Post-Processing Box includes a chart comparing the inlet gas velocity versus dynamic pressure. If the simulated results are in agreement/ conform to the experimental results, the simulated results are validated. If the simulated results do not conform to the experimental results, the simulation results are not validated, and the user may re-run the remote experiments. In a particular embodiment, the engineer/user may either re-run a simulation of this configuration and compare resulting simulated results with the previously obtained experimental results. In another embodiment, the user may re-send a request to the server for additional remote experiments of the facilities to obtain additional experimental results.

Further, in some situations where a particular geometry or configuration is not available in any particular facility or facilities, the simulation results may then be interpolated between at least two separate experimental runs, which may thereby cover the range of conditions simulated in a numerical model. For example, if a user wishes to simulate flow in pipes with a diameter of 5.5", but the available apparatuses only have diameters of 4" and 5", a simulator may be used to interpolate the results between the two pipe sizes. Once the simulator eventually fully validates and tunes the simulated results, it may then send these results back to the user/engineer and/or to the server with the database.

Figure 5:
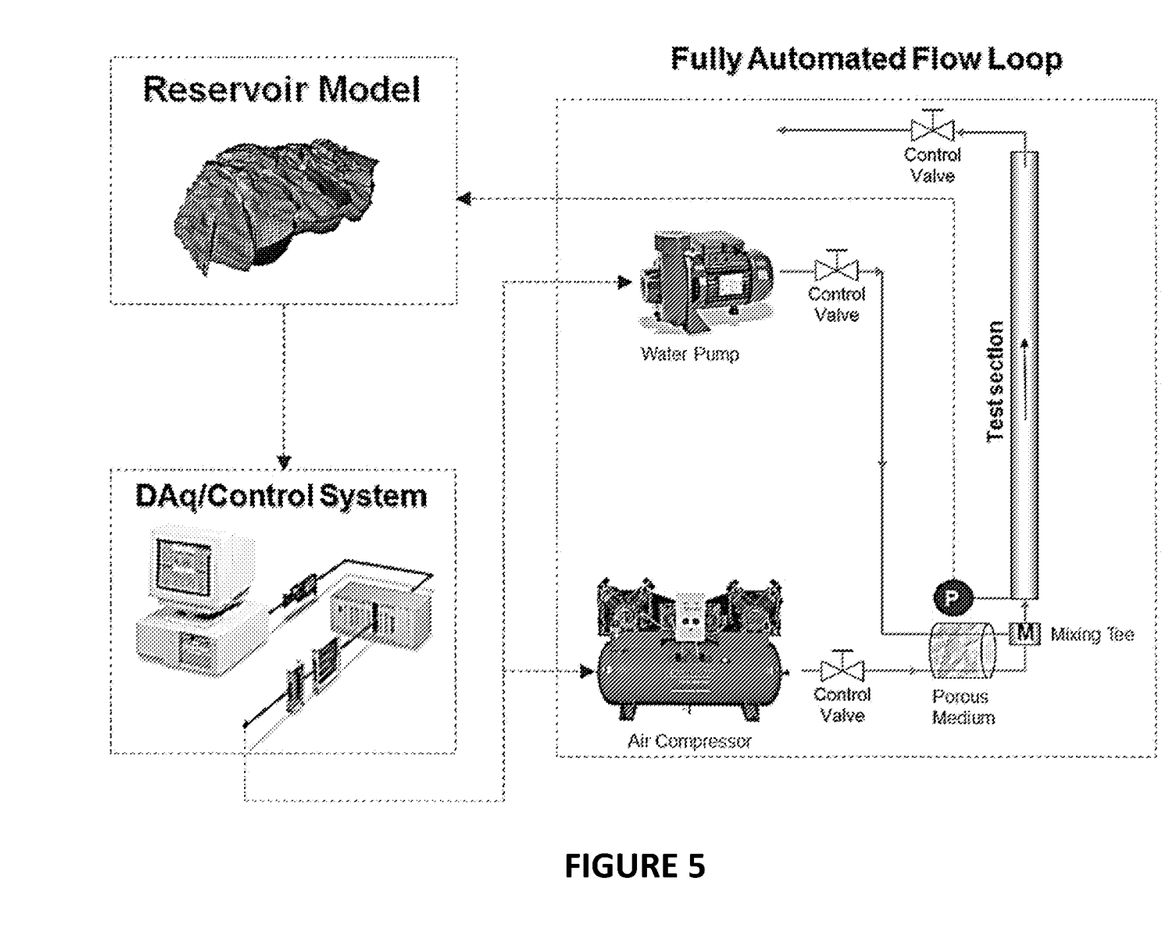
FIG. 5 is a schematic of an experimental set-up for a method for performing remote real-time experiments, according to an exemplary embodiment of the present invention.

Referring to FIG. 5, a schematic of an experimental set-up for a method for performing remote real-time experiments is shown. Particularly, FIG. 5 shows an exemplary experimental set-up for performing remote experiments on well challenges to evaluate liquid loading in gas wells using an integrated wellbore-reservoir model. The set-up may be used to perform remote experiments using the same systems and methods described in FIGS. 2, 3, and 4 herein. As shown, the set-up involves one facility; however, it may be configured to be used in multiple facilities to allow for automatic and remote interconnection between the facilities.

Liquid loading is a very common problem in mature gas fields. It is estimated to occur in at least 90% of the producing gas wells in the U.S. During gas production, liquid (condensate or water) may accumulate at the bottom of the wellbore, increasing downhole pressure and therefore significantly decreasing (or even ending) gas flow. To understand the transient behavior in the reservoir related to liquid loading phenomena, studies such as Zhang et al. (2010) developed a model to capture the transient fluid flow behavior in the near-wellbore reservoir region. The later authors showed that bottomhole pressure oscillations have a significant impact on the inflow performance of the reservoir. The reason for this change in performance is the difference in time scale between the pressure variation in the wellbore and reservoir. While the pressure oscillations in the wellbore vary in the order of milliseconds, the pressure waves in the reservoir travel in the order of minutes or hours. The pressure profile obtained by Zhang indicates that re-injection of heavier fluids into the formation is likely to occur. The simulation results obtained from the fully transient model developed by Zhang was confirmed experimentally in Liu et al. (2014). However, one of the main limitations of the model of Zhang is that the wellbore pressure oscillations used as boundary conditions were created artificially, without the use of a coupled transient model for the wellbore. On the other hand, the experimental set-up of Liu could only capture the reservoir aspect of the modeling, without the multiphase flow in the wellbore.

Embodiments of the present invention provide for systems and methods for performing remote experiments to further investigate the phenomenon of liquid loading in gas wells using an integrated wellbore-reservoir model. In embodiments, since a reservoir cannot be practically attached to a vertical or horizontal pipe (wellbore) in a lab environment restricted by its dimensions and complexity, a remote experiment running simultaneously with a numerical simulator may be able to mimic the dynamics of reservoir inflow performance and the behavior of the multiphase flow in the vertical pipes. As shown in FIG. 5, the experimental set-up involves a vertical pipe, and a porous medium attached or linked to the vertical pipe in such a manner that the set-up may mimic the near-wellbore reservoir region. In an exemplary embodiment, the porous medium may have a cylindrical shape, and may be approximately six to ten feet long, and two to three inches in diameter. However, the porous medium may have any other shape to perform remote experiments.

In embodiments of the present invention, the system may control fluids inflow in the bottom of the vertical pipe by using a previously simulated reservoir model. The simulated reservoir model may provide the values for the fluids inflow. Particularly, a flow loop boosting system using a pump and a gas compressor may artificially create the fluid inflow. The reservoir model may simulate conditions in the reservoir (for e.g., pressure and temperature) and send this information to be inputted at the inlet of the porous medium.

In a particular embodiment, the set-up may be located at one facility, and the porous medium may be directly attached to the vertical pipe to simulate the wellbore-reservoir model. In another embodiment, the set-up may be similar to the system described in FIGS. 3 and 4. In this embodiment, the porous medium may be in a first facility, and the vertical pipe may be in a second facility, and the server may send a request to the first and second facilities to perform automatic and remote interconnected experiments to obtain experimental data regarding bottomhole pressure of the vertical pipe. These requests may be received by DAQ systems located at both facilities, which may then operate in conjunction to provide experimental results using the systems described in FIGS. 3 and 4. As shown in FIG. 5, the server may send a request to a DAQ system located at one facility. The DAQ system may operate electric actuated valves, pumps and/or gas compressors to set conditions in the inlet of the porous medium. See, FIG. 5. Software of the DAQ system may then calculate output pressure results from the porous medium using the known configurations of the porous medium, as described herein. These output pressure results from the porous medium may then be used as the same input (bottomhole) pressure for the vertical pipeline. At this point, once the requested conditions are transferred and/or controlled, the facility may mimic the desired wellbore-reservoir model. The desired experimental results/data may then be acquired through the DAQ system. In various embodiments, these experimental results may be sent to and stored in the server, sent back to a numerical simulator for further validation/tuning with a previously simulated reservoir model, and/or sent back directly to the user.

In some embodiments, a mixing tee may be attached to the bottom of the vertical pipe. Mixing Tees utilize a specifically engineered internal geometry to efficiently mix two fluid streams into one combined stream, and are usually specifically designed for high pressure applications. In other embodiments, the set-up may not include a mixing tee.

While the embodiment shown in FIG. 5 may not fully describe all the mechanisms involved in the interaction between a wellbore and reservoir due to limitations in the reservoir model coupled with the DAQ hardware, it nevertheless may still allow for a scenario whereby the parameters of a reservoir (for e.g., relative permeability, capillary pressure and porosity) may be varied and their impact in liquid loading phenomena may be better understood while using an experimental approach for coupled wellbore-reservoir.

Embodiments of the present invention may not only be used for liquid loading problems, but for several other well challenges where the interaction wellbore-reservoir is important, including but not limited to well tests with wellbore storage effects, well start-up and shut-downs, fluids bull heading and injection, wellbore slugging, well kick-off and cleanup, dynamic water and gas coning.

While the embodiments are described with reference to various implementations and exploitations, it will be understood that these embodiments are illustrative and that the scope of the inventions is not limited to them. Many variations, modifications, additions, and improvements are possible. Further still, any steps described herein may be carried out in any desired order, and any desired steps may be added or deleted.

What is claimed is:

1. A processor-implemented method of controlling a sub-system of a mechanical system having at least two separate mechanical sub-systems, the method comprising:
    receiving, by a processor circuit, a first input signal at a first sub-system from a second sub-system, wherein the first input signal contains information regarding at least one of a time-dependent temperature, pressure, and flow rate of the second sub-system, wherein the first sub-system and the second subsystem are located at a first facility and a second facility, respectively;
    generating a control signal for the first sub-system based on the first input signal received from the second sub-system;
    controlling, at the first sub-system, time-dependent behavior of at least one of an electric actuated valve, pump, and gas compressor, of the first sub-system, based on the control signal so that a dynamical behavior of the first sub-system is influenced by a dynamical behavior of the second sub-system;
    generating an output signal by measuring, using a sensor device of the first sub-system, at least one of a time-dependent temperature, pressure, and flow rate of the first sub-system, wherein the output signal contains information regarding at least one of the time-dependent temperature, pressure, and flow rate of the first sub-system, wherein measuring the at least one of the time-dependent temperature, pressure, and flow rate of the first sub-system generates the output signal that mimics one or more components of a wellbore-reservoir system; and
    sending the output signal to the second sub-system as a second input signal, wherein the output signal mimics a process of running a remote experiment in real time at the first facility, the output signal influencing the dynamical behavior of the second sub-system in real time.

2. The method of claim 1, wherein receiving the first input signal from the second sub-system, comprises receiving the first input signal from a computational device that generates the first input signal based on a numerical simulation that mimics at least one of a time-dependent temperature, pressure, and flow rate of a virtual second sub-system based on a numerical model of an analogous physical second sub-system.

3. The method of claim 2, wherein the numerical model used by the computational device generates the first input signal based on the output signal sent to the second sub-system.

4. The method of claim 1, wherein receiving the first input signal from the second sub-system, comprises receiving the first input signal from a server that is in communication with the second sub-system.

5. The method of claim 1, wherein receiving the first input signal from the second sub-system, comprises receiving the first input signal from a server that generates the first input signal from a numerical model.

6. The method of claim 1, wherein measuring the at least one of the time-dependent temperature, pressure, and flow rate of the first sub-system comprises measuring properties of components of the first sub-system including at least one of a vertical pipe and a porous medium.

7. A first sub-system of a mechanical system having at least two separate mechanical sub-systems, the first sub-system comprising:
    a processor circuit;
    at least one of an electric actuated valve, pump, and gas compressor; and
    a sensor device, wherein the processor circuit is configured to perform operations comprising:
        receiving a first input signal, at the first sub-system from a second sub-system, wherein the first input signal contains information regarding at least one of a time-dependent temperature, pressure, and flow rate of the second subsystem, wherein the first sub-system and the second subsystem are located at a first facility and a second facility, respectively;
        generating a control signal for the first sub-system based on the first input signal received from the second sub-system;
        controlling, at the first sub-system, time-dependent behavior of the at least one of the electric actuated valve, pump, and gas compressor, of the first sub-system, based on the control signal so that a dynamical behavior of the first sub-system is influenced by a dynamical behavior of the second sub-system;

generating an output signal by measuring, using the sensor device of the first sub-system, at least one of a time-dependent temperature, pressure, and flow rate of the first sub-system, wherein the output signal contains information regarding at least one of the time-dependent temperature, pressure, and flow rate of the first sub-system, where the output signal is generated to mimic one or more components of a wellbore-reservoir system based on measuring the at least one of time-dependent temperature, pressure, and flow rate of the first sub-system; and sending the output signal to the second sub-system as a second input signal, wherein the output signal mimics a process of running a remote experiment in real time at the first facility, the output signal influencing the dynamical behavior of the second sub-system in real time.

8. The first sub-system of claim 7, wherein the processor circuit is further configured to perform operations comprising:
receiving the first input signal from a computational device that generates the first input signal based on a numerical simulation that mimics at least one of a time-dependent temperature, pressure, and flow rate of a virtual second sub-system based on a numerical model of an analogous physical second sub-system.

9. The first sub-system of claim 8, wherein the processor circuit is further configured to perform operations comprising:
generating the control signal for the first sub-system based on the first input signal received from the second sub-system which was generated by the computational device based on the output signal sent to the second sub-system.

10. The first sub-system of claim 7, wherein the processor circuit is further configured to perform operations comprising:
receiving the first input signal from a server that is in communication with the second sub-system.

11. The first sub-system of claim 7, wherein the processor circuit is further configured to perform operations comprising:
receiving the first input signal from a server that generates the first input signal from a numerical model.

12. The first sub-system of claim 7, further comprising: at least one of a vertical pipe and a porous medium, wherein measuring the at least one of time-dependent temperature, pressure, and flow rate of the first sub-system comprises measuring properties of the at least one of the vertical pipe and the porous medium.

13. The first sub-system of claim 7, further comprising a vertical pipe, wherein the processor circuit is further configured to perform operations comprising:
receiving the first input signal, at the first sub-system from the second sub-system that comprises a porous medium, wherein the first input signal contains information regarding at least one of a time-dependent temperature, pressure, and flow rate of the porous medium;
generating a control signal for the first sub-system; and
controlling, at the first sub-system, time-dependent behavior of the at least one of the electric actuated valve, pump, and gas compressor, of the first sub-system, based on the control signal so that the dynamical behavior of the vertical pipe behaves as if it were physically coupled to the porous medium of the second sub-system.

14. A processor-implemented method of controlling a mechanical system comprising first and second sub-systems, the method comprising:
receiving, by a processor circuit configured to perform operations in response to determining that a remote experiment comprising the mechanical system has not been run before with the first and second sub-systems corresponding to a first desired configuration at a first facility and a second desired configuration at a second facility, respectively, first and second dynamical output signals from the first and second sub-systems, respectively;
providing the first dynamical output signal from the first sub-system to the second sub-system as a second input signal; and
providing the second dynamical output signal from the second sub-system to the first sub-system as a first input signal, wherein the first and second dynamical output signals and the first and second input signals received from and sent to the first and second sub-systems cause a dynamical behavior of the first and second sub-systems to influence one another in real time, wherein the dynamical behavior of the first and second sub-systems mimic one or more components of a wellbore-reservoir system.

15. The processor-implemented method of claim 14, wherein the dynamical behavior of the first and second sub-systems mimic a system wherein the first sub-system comprises a vertical pipe and the second sub-system comprises a porous medium.

16. A system that controls a mechanical system comprising first and second sub-systems, the system comprising:
a server in communication with the first and second sub-systems, the server configured to search a database for experimental data from a remote experiment comprising the mechanical system with the first and second sub-systems corresponding to a first desired configuration at a first facility and a second desired configuration at a second facility, respectively; and
a processor circuit that is configured to perform operations in response to the server not being able to find the experimental data, comprising:
receiving first and second dynamical output signals from the first and second sub-systems, respectively;
providing the first dynamical output signal from the first sub-system to the second sub-system as a second input signal; and
providing the second dynamical output signal from the second sub-system to the first sub-system as a first input signal, wherein the first and second dynamical output signals and the first and second input signals received from and sent to the first and second sub-systems cause a dynamical behavior of the first and second sub-systems to influence one another in real time, wherein the dynamical behavior of the first and second sub-systems mimic one or more components of a wellbore-reservoir system.

17. The system of claim 16, further comprising:
communication circuitry configured to receive and transmit the dynamical output and the first and second input signals from and to the first and second sub-systems via a wired connection, via a wireless connection, or via an internet connection.

* * * * *